United States Patent [19]
Wu

[11] Patent Number: 6,137,131
[45] Date of Patent: Oct. 24, 2000

[54] DRAM CELL WITH A MULTIPLE MUSHROOM-SHAPED CAPACITOR

[75] Inventor: Shye-Lin Wu, Hsinchu, Taiwan

[73] Assignee: Texas Instrumants - Acer Incorporated, Hsinchu, Taiwan

[21] Appl. No.: 08/999,449

[22] Filed: Dec. 29, 1997

[30] Foreign Application Priority Data

Aug. 22, 1997 [TW] Taiwan ................................. 86112282

[51] Int. Cl.⁷ .................... H01L 29/68; H01L 27/108; H01L 27/00
[52] U.S. Cl. .......................... 257/309; 257/534
[58] Field of Search ................... 257/309, 534, 257/308, 307, 532, 528

[56] References Cited

U.S. PATENT DOCUMENTS

| 5,138,411 | 8/1992 | Sandha | 257/309 |
| 5,459,345 | 10/1995 | Okudaira et al. | 257/310 |
| 5,561,310 | 10/1996 | Woo et al. | 257/309 |
| 5,623,243 | 4/1997 | Watanabe et al. | 257/309 |

FOREIGN PATENT DOCUMENTS

| 5-315556 | 11/1993 | Japan | 257/309 |
| 6-151753 | 5/1994 | Japan | 257/309 |

OTHER PUBLICATIONS

M. Sakao et al., A Capacitor–Over–Bit–Line (COB) Cell with a Hemispherical–Grain Storage Node for 64Mb DRAMs, 1990 IEEE, pp. 655–658.

Sanggi Yu et al., The Honeycomb–Shape Capacitor Structure for ULSI DRAM, 1993 IEEE, pp. 369–371.

Shye Lin Wu et al., Tunnel Oxide Prepared by Therman Oxidation of Thin Polysilicon Film on Silicon (TOPS), 1993 IEEE, pp. 379–381.

S.H. Woo et al., Selective Etching Technology of in–situ P Doped Poly–Si (SEDOP) for High Density DRAM Capacitors, 1994 IEEE, pp. 25 and 26.

*Primary Examiner*—Donald L. Monin, Jr.
*Attorney, Agent, or Firm*—Harness, Dickey & Pierce, P.L.C.

[57] ABSTRACT

The capacitor includes a first storage node formed over a semiconductor wafer. The first storage node has a plurality of mushroom-shape structures. The plurality of mushroom-shape structures are randomly arranged on the first storage node to increase the area of the first storage node. A dielectric layer conformally covers the first storage node. A second storage node is formed on the dielectric layer.

27 Claims, 3 Drawing Sheets

DRAM CELL WITH A MULTIPLE MUSHROOM-SHAPED CAPACITOR

FIELD OF THE INVENTION

The present invention relates to semiconductor capacitors, and more specifically, to a structure of a DRAM cell having a multiple mushroom-shape capacitor.

BACKGROUND OF THE INVENTION

Semiconductor Dynamic Random Access Memory (DRAM) devices have been applied in integrated circuits for many years. A memory cell is provided for each bit stored by a DRAM device. Each memory cell typically consists of a storage capacitor and an access transistor. The source of the access transistor is connected to one terminal of the capacitor. The transistor gate electrode is connected to external connection lines called a bit line and a word line, respectively. The other terminal of the capacitor is connected to a reference voltage. Therefore, the formation of a DRAM memory cell comprises the formation of a transistor, a capacitor and contacts to external circuits.

With the trend of making semiconductor devices, the sizes of memory cells have gotten smaller and smaller. Thus, the area available for a single memory cell has become very small. This has caused a reduction in capacitor area, which in turn has resulted in a reduction in cell capacitance. For very small memory cells, the planar capacitor has become very difficult to use reliably. Specifically, as the size of the capacitor has decreased, the capacitance of the capacitor also has decreased and the amount of the charge capable of being stored by the capacitor has similarly decreased. This has resulted in the capacitor being very susceptible to α particle interference. Additionally, as the capacitance decreases, the charges held by storage capacitor must be refreshed often.

Prior art approaches to overcome these problems have resulted in the development of various types of capacitors. One of the capacitors has a honeycomb-shape capacitor structure. The process uses the characteristic that the oxidation rate at grain boundary is higher than that at the grain itself, and the oxide is thicker at the grain boundary. Then, an etching mask is formed over the grain boundary by etching process. Finally, the etching mask is used for generating the honeycomb-shape capacitor structure. However, the structure has a plurality of tips formed thereon, which will result leakage current in the structure. Please see "The Honeycomb-Shape Capacitor Structure for ULSI DRAM, "S. Yu et al., IEEE Electron Device Lett., vol. 14, p.369, 1993" and Tunnel Oxide Prepared by Thermal Oxidation of Thin Polysilicon Film on Silicon, "S. L. Wu et al., IEEE Electron Device Lett., vol. 14, p.379, 1993".

Further, a capacitor over bit line (COB) cell with a hemispherical grain silicon storage node has been developed (see "Capacitor Over Bit Line Cell With Hemispherical Grain Storage Node For 64 Mb DRAMs", M. Sakao et al., microelectronics research laboratories, NEC Corporation, IEDM Tech Dig., Dec. 1990, pp655–658). The HSG-silicon is deposited by low pressure chemical vapor deposition method at the transition temperature from amorphous silicon to polycrystalline silicon. This memory cell provides about two times the capacitance by increasing the effective surface area of a simple storage node. The following art teaches a highly selective etching method between HSG-silicon and polysilicon. Please see "Selective Etching Technology of in-situ P Doped Poly-Si (SETOP) for High Density DRAM Capacitors, "S. H. Woo et al., 1994, Symposium on VLSI Technology Digest of Technical Papers". The present invention will use this method to form the storage node of a capacitor.

SUMMARY OF THE INVENTION

The structure of the mushroom shape capacitor includes a mushroom-shape first storage node, a dielectric layer and a second storage node. The mushroom-shape first storage node includes a base portion that is formed of polysilicon. A plurality of mushroom neck portions are located on the base portion. A plurality of roof portions are connected on the tops of the mushroom neck portions. The roof portions are formed of hemispherical grained silicon (HSG-silicon). The dielectric layer conformally covers the surface of the mushroom shape storage node. The second storage node encloses the surface of the dielectric layer.

A first conductive layer is formed over a wafer. Then, an undoped hemispherical grains silicon (HSG-silicon) is formed on the first conductive layer. The HSG-silicon is optionally separated along the grain boundaries to expose a portion of the first conductive layer. Next, the exposed first conductive layer is etched by using the HSG-silicon layer as a mask. Next, an ion implantation is used to dope ions into the HSG-silicon for increasing conductivity. Then, a lithography and an etching processes are used to define a first storage node.

A dielectric layer is then deposited on the exposed surface of the first conductive layers, and the HSG-silicon. The dielectric layer is preferably formed of either a double film of silicon nitride, silicon oxide, a triple film of silicon oxide, silicon nitride, silicon oxide or any other high dielectric film such as tantalum pentoxide($Ta_2O_5$), BST, or PZT. After the dielectric layer is deposited, a second conductive layer is formed over the dielectric layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 5:
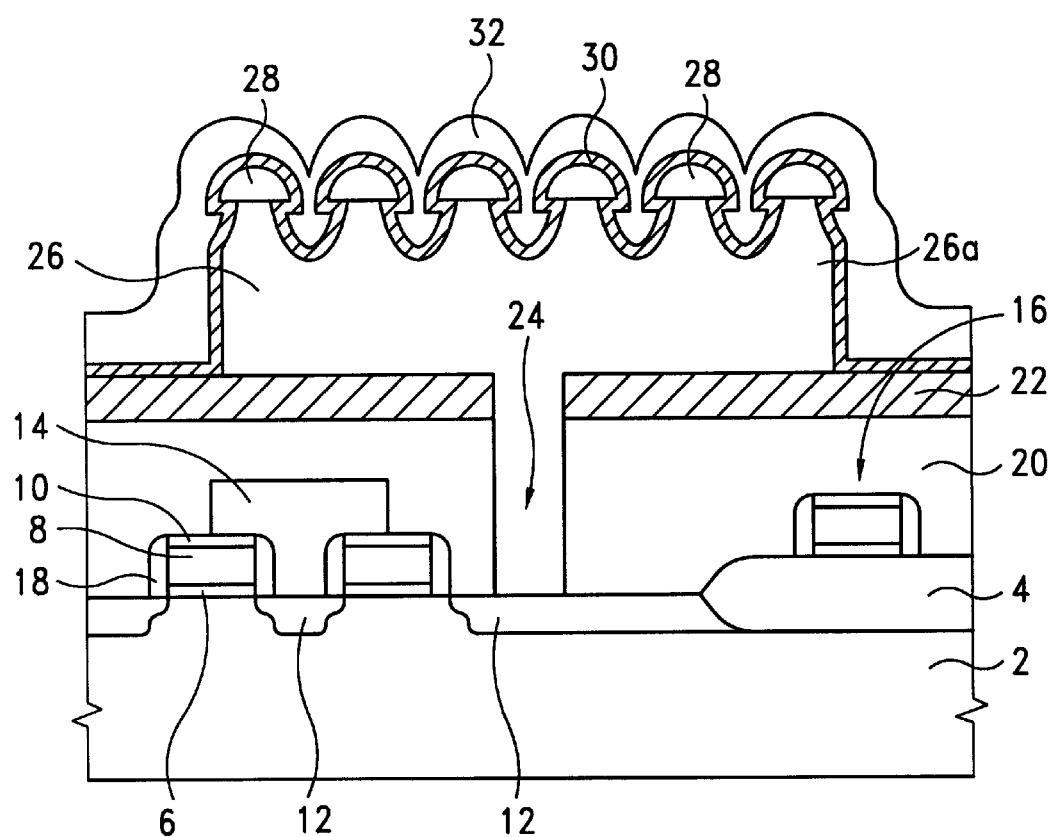
FIG. 5 is a cross-sectional view of a semiconductor wafer illustrating the step of forming a dielectric film along the surface of the first polysilicon layer and the separated HSG-silicon, and forming a second polysilicon layer on the dielectric film.

A new structure of a capacitor for a DRAM is disclosed herein. The cross sectional view of a multiple mushroom-shape capacitor for a DRAM cell is shown in FIG. 5. The structure of the multiple mushroom-shape capacitor includes (1) a multiple mushroom-shape first storage node 26, 26a, 28 (2) a dielectric layer 30 and (3) a second storage node 32. One feature of the capacitor is that the first storage node is formed to have a plurality of mushroom-shape structures in cross-sectional view.

The first storage node includes a base portion 26 that is formed of conductive material and formed over a semiconductor wafer 2. Preferably, the base portion 26 is formed of doped polysilicon or an in-situ doped polysilicon. A plurality of mushroom neck portions 26a located on the base portion 26 are also formed of conductive material. Similarily, the mushroom neck portions 26a are preferably formed of doped polysilicon or in-situ doped polysilicon. Each of the mushroom neck portions 26a are separated with one another and are randomly arranged on the base portions 26. Thus, a plurality of cavities 28a are formed between the mushroom neck portions 26a to increase the area of the first storage node.

A plurality of mushroom roof portions 28 are connected on the tops of the mushroom neck portions 26a. Each mushroom roof portions 28 are also separated with one another. The bottom surface area of the mushroom roof portion 28 is larger than that of the top surface of the mushroom neck portions 26a. The mushroom roof portions 28 are formed of hemispherical grained silicon (HSG-silicon). Moreover, the mushroom roof portions 28 are randomly generated by using a hemispherical grain silicon (HSG-silicon) technique. So that the storage capacitance of this cell is significantly increased compared to the conventional stacked capacitor. The dielectric layer is conformally covered the surface of the mushroom shape storage node. The second storage node encloses the surface of the dielectric layer and is formed of conductive material, such as doped polysilicon or in-situ doped polysilicon.

The formation of the mushroom-shape capacitor described herein includes many process steps that are well known in the art. For example, the processes of lithography and etching are well known in the art and are used extensively herein without a related discussion of these well known technologies. In addition, the present invention uses residual HSG-silicon as an etching mask to form the capacitor structure. Furthermore, the high etching selectivity between undoped HSG-silicon and polysilicon is used to form the mushroom-shape capacitor.

Figure 1:
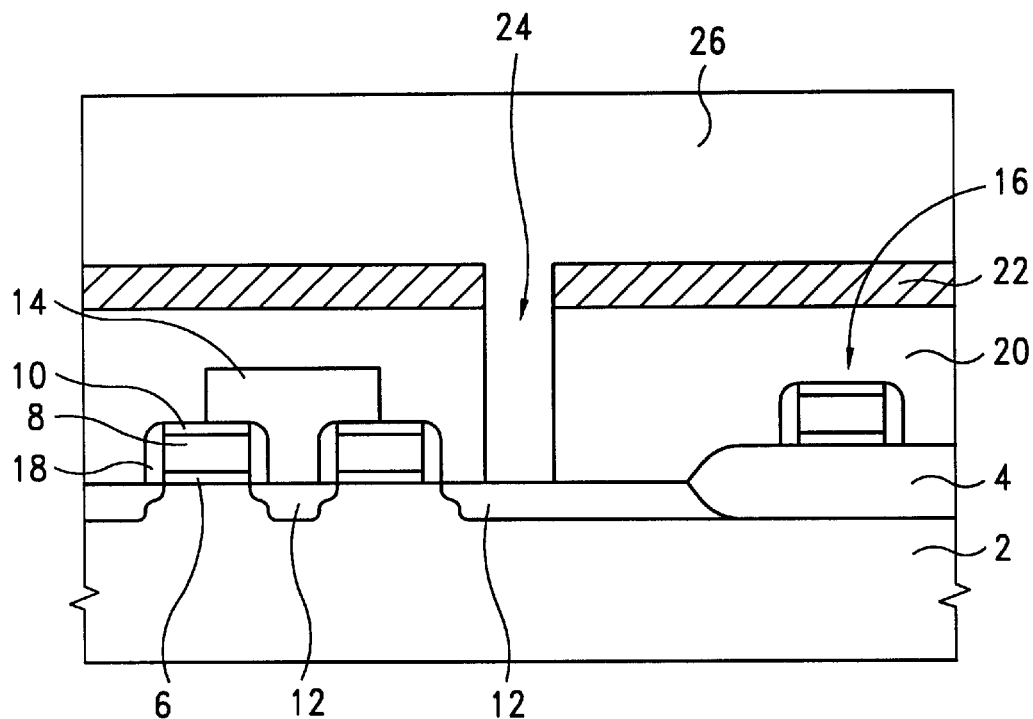
FIG. 1 is a cross-sectional view of a semiconductor wafer illustrating the step of forming transistors, a first dielectric layer, a dioxide layer and a first polysilicon layer on a semiconductor wafer.

As shown in FIG. 1, in a preferred embodiment, a semiconductor wafer 2 with a <100> crystallographic orientation is provided. An isolation technology, such as field oxide (FOX) or trench isolation, is used for providing isolation between devices. In a case, a thick FOX region 4 is formed to provide isolation between devices on the wafer 2. The FOX region is created in a conventional manner. For example, the FOX region can be formed via lithography and dry etching steps to etch a silicon nitride and a silicon dioxide composition layer. After the photoresist is removed and wet cleaned, thermal oxidation in an oxygen steam environment is used to grow the FOX 4. Typically the thickness of the FOX is about 3000–8000 angstroms.

Next, a silicon dioxide layer 6 is created on the top surface of the wafer 2 to serve as the gate oxide for subsequently formed metal oxide silicon field effect transistors (MOSFETs). In one embodiment, the silicon dioxide layer 6 is formed by using an oxygen steam ambient, at a temperature of about 800–1100° C. Alternatively, the oxide layer may be formed using any suitable oxide chemical compositions and procedures. In this embodiment, the thickness of the silicon dioxide layer is approximately 30–200 angstroms.

A doped first polysilicon layer 8 is then formed over the FOX 4 and the silicon dioxide layer 6 using a low pressure chemical vapor deposition (LPCVD) process. In this embodiment, the first polysilicon layer has a thickness of about 500–2000 angstroms. A metal silicide layer or cap layer 10 is formed on the first polysilicon layer 6. Next, standard lithography and etching steps are used to form a gate structure and a local interconnection, for example, a word line 16. Subsequently, active regions 12 (i.e., the source and the drain) are formed by using well known processes to implant appropriate impurities in those regions. Side wall spacers 18 are also formed on the side walls of the gate 8 using conventional processes. Then a metal layer is formed over the wafer 2, well known patterning and etching processes are used to etching the metal layer to form a bit line 14.

Turning to FIG. 1, a first dielectric layer 20 is formed over the semiconductor wafer 2. The first dielectric layer 20 is preferably formed by using suitable material such as borophosphosilicate glass (BPSG), silicon nitride or silicon dioxide. The thickness of the first dielectric layer is about 3000–10000 angstroms. Next, a second dielectric layer 22 is deposited on the first dielectric layer 20 to serve as a barrier to prevent the first dielectric layer from etching for subsequent process. The second dielectric layer 22, if used, is preferably formed of different material, such as CVD-oxide. The thickness of the second dielectric layer 22 is preferably about 500–2000 angstroms.

A contact hole 24 is formed in the first dielectric layer 20 and in the second dielectric layer 22 by patterning and etching. A first conductive layer, such as a second polysilicon layer 26, is formed over and in the contact hole 24 and on the second dielectric layer 22. The second polysilicon layer 26 is preferably formed using conventional LPCVD processing. The thickness of the second polysilicon layer 26, as measured over the second dielectric layer 22, is preferably in the range of 3000–10000 angstroms. The second polysilicon layer 26 is preferably either doped polysilicon or in-situ doped polysilicon.

Figure 2:
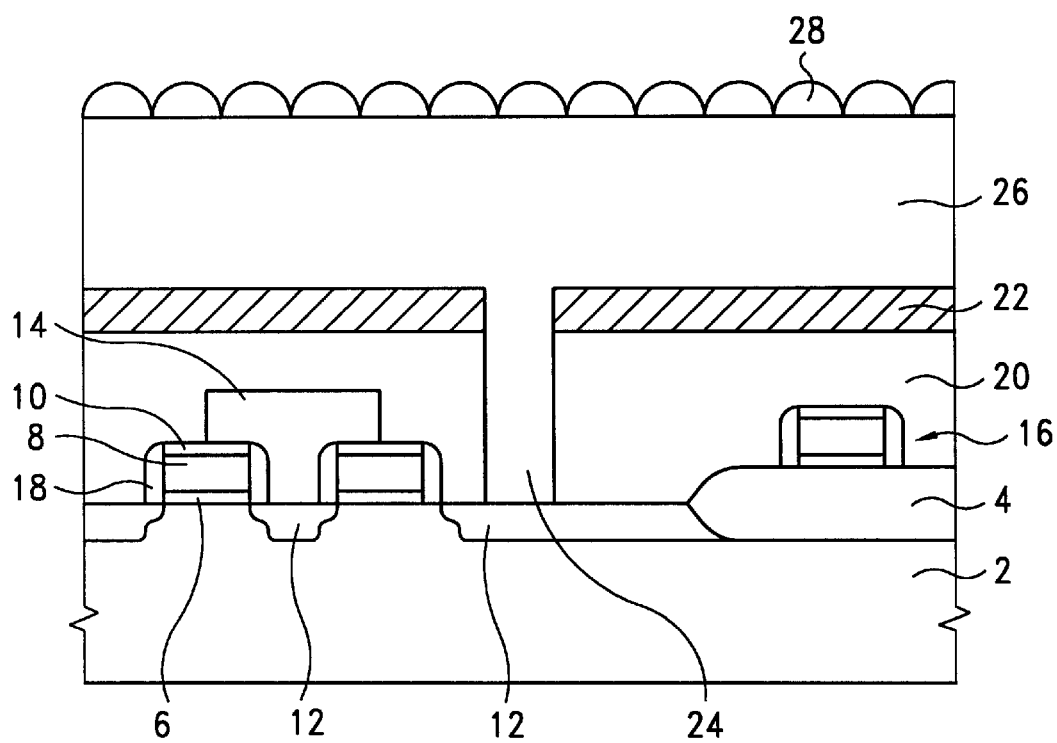
FIG. 2 is a cross-sectional view of a semiconductor wafer illustrating the step of forming a undoped hemispherical grained silicon (HSG-silicon) on the first polysilicon layer.
Figure 3:
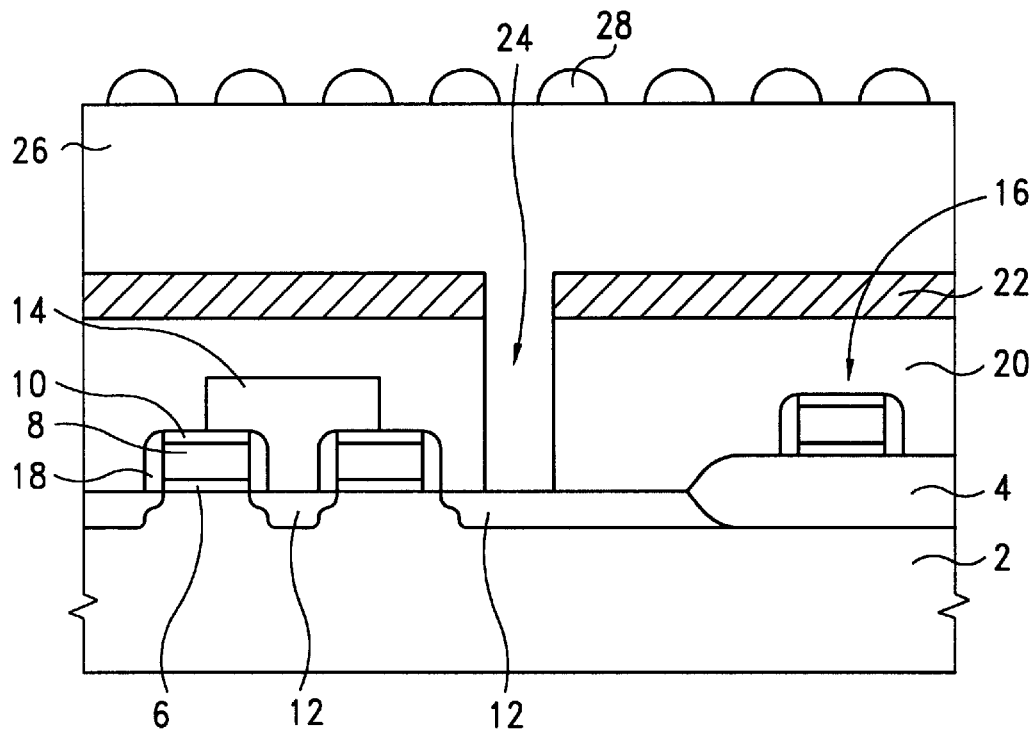
FIG. 3 is a cross-sectional view of a semiconductor wafer illustrating the step of separating the HSG-silicon.
Figure 4:
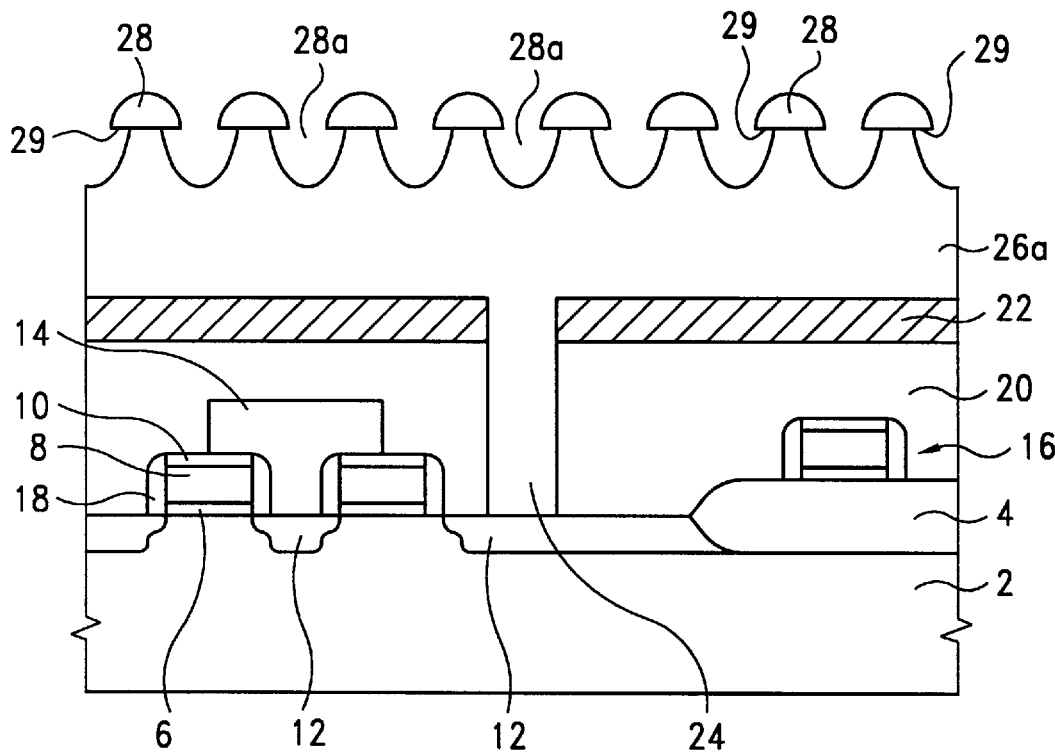
FIG. 4 is a cross-sectional view of a semiconductor wafer illustrating the step of etching the first polysilicon layer using the separated HSG-silicon as a mask.

Turning now to FIG. 2, an undoped hemispherical grain silicon (HSG-silicon) 28 is formed on the second polysilicon layer 26 having a thickness about 300–1000 angstroms. Turning next to FIG. 3, the HSG-silicon 28 is optionally separated along the grain boundaries to expose a portion of the second polysilicon layer 26. This can be done by using a slight dry etching to etch the HSG-silicon 28. A plurality of residual HSG-silicon islands 28 are left on the first polysilicon layer 26. Next, as shown in FIG. 4, the exposed second polysilicon layer 26 is etched by hot phosphorus solution using the HSG-silicon layer 28 as a mask to form a plurality of cavities 28a in the second polysilicon layer 26 (See U.S. Pat. No. 5,286,668). The temperature of the process is about 140–180° C., the etching selectivity between the second polysilicon 26 and the HSG-silicon 28 is about 50 to 1. Further, a solution mixed with $HNO_3$, $CH_3COOH$, HF, DI can be used to act as the etchant. The etching selectivity ranges from 60:1 to 80:1. The second polysilicon layer 26 is isotropically etched using the HSG-silicon 28 as a mask to create a plurality of mushroom-shape structures on the second polysilicon layer 26. Because the isotropic etching and the etching selectivity between the second polysilicon 26 and the HSG-silicon 28 may be from 60:1 to 80:1, a plurality of almost horizontal surfaces 29 are formed on each bottom surface area of the mushroom roof portion 28, which is why the bottom surface area of the mushroom roof portion 28 is larger than that of top surface of the mushroom neck portions 26a. This mushroom-shape structures server as a first storage node of a capacitor. Next, an ion implantation is used to dope ions into the HSG-silicon 28 for increasing the conductivity. Then, a lithography and an etching processes are used to define the first storage node.

Referring to FIG. 5, a dielectric layer 30 is then deposited on the exposed surface of the second polysilicon layers 26, and the HSG-silicon 28. The dielectric layer 30 is preferably formed of either a double film of silicon nitride, silicon oxide, a triple film of silicon oxide, silicon nitride, silicon oxide or any other high dielectric film such as tantalum pentoxide($Ta_2O_5$), BST, PZT. After the dielectric layer 30 is deposited, a second conductive layer 32 is formed over the dielectric layer 30. Preferably, a third polysilicon layer is deposited using a conventional LPCVD process to serve as the second conductive layer 32. The third polysilicon layer 32 provides a second storage electrode and is formed of doped polysilicon, in-situ doped polysilicon. The second storage node can also be formed by using aluminum, copper, tungsten or titanium. Thus, a semiconductor capacitor is formed which comprises a second storage electrode 32, a dielectric layer 30, and a mushroom-shape structures 26, 26a, 28 as the first storage electrode.

The present invention thus provides capacitors with an enlarged surface area. The mushroom shape capacitor structure increases the surface area of the capacitor. Therefore the present invention increases the performance of the capacitor. Further, the present invention will not result in a problem associated with leakage current.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A multiple mushroom-shape capacitor formed over a semiconductor wafer, said multiple mushroom-shape capacitor comprising:

a base portion that is formed over said semiconductor wafer;

a plurality of mushroom neck portions located on said base portion, each of said mushroom neck portions being separated with one another and being randomly arranged on said base portions, therefore, a plurality of cavities being formed between said mushroom neck portions to increase the area of said mushroom-shape capacitor;

a plurality of mushroom roof portions connected on tops of said mushroom neck portions, each mushroom roof portions being separated with one another, a plurality of almost horizontal surfaces being formed on each bottom surface of the mushroom roof portions, a bottom surface area of said mushroom roof portion being larger than a top surface area of said mushroom neck portions, said mushroom roof portions being randomly generated on said plurality of mushroom neck portions, wherein said mushroom roof portions, said mushroom neck portions, said base portion serving as a first storage node of said multiple mushroom-shape capacitor;

a dielectric layer conformally covering said first storage node; and a second storage node formed on said dielectric layer.

2. The capacitor of claim 1, wherein said base portion is formed of conductive material.

3. The capacitor of claim 2, wherein said base portion is formed of doped polysilicon.

4. The capacitor of claim 2, wherein said base portion is formed of in-situ doped polysilicon.

5. The capacitor of claim 1, wherein said mushroom neck portions are formed of conductive material.

6. The capacitor of claim 5, wherein said base portion mushroom neck portions are formed of doped polysilicon.

7. The capacitor of claim 5, wherein said mushroom neck portions are formed of in-situ doped polysilicon.

8. The capacitor of claim 1, wherein said mushroom roof portions are formed of hemispherical grained silicon (HSG-silicon).

9. The capacitor of claim 8, wherein said mushroom roof portions are generated by a hemispherical grains silicon (HSG-silicon) technique.

10. The capacitor of claim 1, wherein said second storage node is formed of doped polysilicon.

11. The capacitor of claim 1, wherein said second storage node is formed of in-situ doped polysilicon.

12. The capacitor of claim 1, wherein said dielectric layer is formed of tantalum pentoxide ($Ta_2O_5$).

13. The capacitor of claim 1, wherein said dielectric layer is formed of BST.

14. The capacitor of claim 1, wherein said dielectric layer is formed of PZT.

15. The capacitor of claim 1, wherein said dielectric layer is formed of a triple film of silicon oxide, silicon nitride, silicon oxide.

16. The capacitor of claim 1, wherein said dielectric layer is formed of a double film of silicon nitride, silicon oxide.

17. A multiple mushroom-shape capacitor formed over a semiconductor wafer, said multiple mushroom-shape capacitor comprising:

a base portion formed over said semiconductor wafer and being formed of doped polysilicon;

a plurality of mushroom neck portions located on said base portion, each of said mushroom neck portions being separated with one another and being randomly arranged on said base portions, therefore, a plurality of cavities being formed between said mushroom neck portions to increase the area of said mushroom-shape capacitor, wherein said plurality of mushroom neck portions are formed of doped polysilicon;

a plurality of mushroom roof portions connected on tops of said mushroom neck portions, each mushroom roof portions being separated with one another, a plurality of almost horizontal surfaces being formed on each bottom surface of the mushroom roof portions, a bottom surface area of said mushroom roof portion being larger than a top surface area of said mushroom neck portions, said mushroom roof portions being randomly generated on said plurality of mushroom neck portions, wherein said mushroom roof portions, said mushroom neck portions, said base portion serving as a first storage node of said multiple mushroom-shape capacitor, wherein said mushroom roof portions are formed of hemispherical grained silicon (HSG-silicon);

a dielectric layer conformally covering said first storage node; and a second storage node formed on said dielectric layer.

18. The capacitor of claim 17, wherein said base portion is formed of in-situ doped polysilicon.

19. The capacitor of claim 17, wherein said mushroom neck portions are formed of in-situ doped polysilicon.

20. The capacitor of claim 17, wherein said mushroom roof portions are generated by a hemispherical grains silicon (HSG-silicon) technique.

21. The capacitor of claim 17, wherein said second storage node is formed of doped polysilicon.

22. The capacitor of claim 17, wherein said second storage node is formed of in-situ doped polysilicon.

23. The capacitor of claim 17, wherein said dielectric layer is formed of tantalum pentoxide ($Ta_2O_5$).

24. The capacitor of claim 17, wherein said dielectric layer is formed of BST.

25. The capacitor of claim 17, wherein said dielectric layer is formed of PZT.

26. The capacitor of claim 17, wherein said dielectric layer is formed of a triple film of silicon oxide, silicon nitride, silicon oxide.

27. The capacitor of claim 17, wherein said dielectric layer is formed of a double film of silicon nitride, silicon oxide.

* * * * *